US007692281B2

(12) United States Patent
McAlonis et al.

(10) Patent No.: US 7,692,281 B2
(45) Date of Patent: Apr. 6, 2010

(54) LAND GRID ARRAY MODULE WITH CONTACT LOCATING FEATURES

(75) Inventors: Matthew Richard McAlonis, Elizabethtown, PA (US); Justin Shane McClellan, Camp Hill, PA (US); James Lee Fedder, Etters, PA (US)

(73) Assignee: Tyco Electronics Corporation, Middletown, PA (US)

( * ) Notice: Subject to any disclaimer, the term of this patent is extended or adjusted under 35 U.S.C. 154(b) by 205 days.

(21) Appl. No.: 11/707,294

(22) Filed: Feb. 16, 2007

(65) Prior Publication Data

US 2008/0200042 A1 Aug. 21, 2008

(51) Int. Cl.
*H01L 23/48* (2006.01)
*H01R 13/24* (2006.01)

(52) U.S. Cl. ........................ 257/690; 257/691; 257/668; 257/798; 257/678; 439/66; 439/862; 439/73; 439/91; 439/595; 439/71

(58) Field of Classification Search ................. 257/690, 257/691, 668, 798, 678; 439/862, 73, 91, 439/71, 66
See application file for complete search history.

(56) References Cited

U.S. PATENT DOCUMENTS

| | | | | |
|---|---|---|---|---|
| 5,196,672 | A | 3/1993 | Matsuyama et al. | |
| 5,196,726 | A | 3/1993 | Nishiguchi et al. | |
| 5,308,252 | A * | 5/1994 | Mroczkowski et al. | 439/66 |
| 5,477,086 | A | 12/1995 | Rostoker et al. | |
| 5,767,580 | A | 6/1998 | Rostoker | |
| 6,106,316 | A * | 8/2000 | Barringer et al. | 439/263 |
| 6,241,531 | B1 * | 6/2001 | Roath et al. | 439/66 |
| 6,325,280 | B1 * | 12/2001 | Murphy | 228/246 |
| 6,354,844 | B1 | 3/2002 | Coico et al. | |
| 6,362,637 | B2 * | 3/2002 | Farnworth et al. | 324/755 |
| 6,724,095 | B2 | 4/2004 | D'Amato et al. | |
| 6,778,406 | B2 * | 8/2004 | Eldridge et al. | 361/776 |
| 7,180,321 | B2 * | 2/2007 | Behziz et al. | 324/765 |
| 7,341,485 | B2 * | 3/2008 | Polnyi | 439/591 |
| 7,377,792 | B2 * | 5/2008 | Ma | 439/71 |
| 2005/0164527 | A1 * | 7/2005 | Radza et al. | 439/66 |
| 2005/0208749 | A1 * | 9/2005 | Beckman et al. | 438/613 |
| 2006/0186906 | A1 * | 8/2006 | Bottoms et al. | 324/754 |
| 2007/0054512 | A1 * | 3/2007 | Hougham et al. | 439/66 |
| 2008/0020638 | A1 * | 1/2008 | Polnyi | 439/591 |
| 2008/0072422 | A1 * | 3/2008 | Levante et al. | 29/852 |
| 2008/0090429 | A1 * | 4/2008 | Mok et al. | 439/81 |
| 2008/0112139 | A1 * | 5/2008 | Vinciarelli et al. | 361/709 |

* cited by examiner

*Primary Examiner*—Alexander O Williams

(57) ABSTRACT

A land grid array module is provided that includes a land grid array interface. The interface includes a substrate having a mating face. A contact pad is provided on the mating face of the substrate. The contact pad has an exposed surface with a depression that is configured to restrain transverse movement of a mating contact tip when the mating contact tip is loaded against the contact pad. The substrate layer may include a via having a diameter such that the depression is formed in the contact pad when the contact pad is plated over the via. The depression may also be stamped in the exposed surface of the contact pad. Alternatively, the depression may be surrounded by a raised conductive perimeter that is configured to retain the mating contact tip.

16 Claims, 4 Drawing Sheets

LAND GRID ARRAY MODULE WITH CONTACT LOCATING FEATURES

BACKGROUND OF THE INVENTION

The invention relates generally to land grid array (LGA) electronic modules and, more particularly, to features for locating the contact pads on an LGA module to the contacts in an LGA socket.

Competition and market demands have continued the trends toward faster, higher performance electrical systems, particularly with regard to computer systems. Along with the development of surface mount technology in the design of printed circuit boards, higher density electrical circuits, including higher density interconnect components have been developed to meet the increasing demand for higher performance electrical systems.

As is known in the art, surface mountable packaging allows for the connection of the package to pads on the surface of the circuit board rather than by contacts or pins soldered in plated holes extending through the circuit board. As used herein, the term “package” shall include at least a chip carrying module that is to be mounted to a circuit board. Surface mount technology allows for an increased component density on a circuit board, thereby saving space on the circuit board.

Area array socket connectors have evolved, along with surface mount technology, as one high density interconnect methodology. One application of surface mount technology, for example, is the land grid array (LGA) socket connector that is used with an LGA package. One major advantage of the LGA package is durability. The LGA package is not easily damaged during the installation or removal process or by handling in general. The LGA package includes an array of contact areas or pads on the mating side. The LGA socket includes an array of contacts and the circuit board includes a pad pattern or contact pad array that both correspond to the contact pad pattern on the LGA package.

When loaded into the socket, the LGA package registers on the interior side walls of the socket to locate the package with respect to the socket contacts. Because there is a nominal clearance between the socket walls and the LGA package, the contact pads on the package must contain sufficient surface areas to absorb the tolerances between the package and the socket, as well as any linear translation or wiping of the contacts across the contact pads upon deflection of the contacts when the package is loaded into the socket.

As the package becomes smaller and the contact pad and socket contact densities increase, the contact pad and contact spacing approach the combined manufacturing tolerances of the electronic package and the socket. Thus, maintaining proper registration of socket contacts with the contact pads becomes a challenge as package size decreases.

BRIEF DESCRIPTION OF THE INVENTION

In one aspect, a land grid array interface is provided. The land grid array interface includes a substrate having a mating face. A contact pad is provided on the mating face of the substrate. The contact pad has an exposed surface with a depression that is configured to restrain transverse movement of a mating contact tip when the mating contact tip is loaded against the contact pad.

More specifically, the substrate may include a via having a diameter such that the depression is formed in the contact pad when the contact pad is plated over the via. The depression may also be stamped in the exposed surface of the contact pad. Alternatively, the depression may be surrounded by a raised conductive perimeter that is configured to retain the mating contact tip.

In another aspect, a land grid array module is provided that includes a substrate having a mating face. A contact pad is provided on the mating face of the substrate. The contact pad is configured to capture and retain a mating contact tip in registration with the contact pad when the mating contact tip is loaded against the contact pad.

In a further aspect, a land grid array module is provided that includes a substrate layer having a mating face configured to be loaded into a socket connector. An array of contact pads is provided on the mating face of the substrate layer. Each of the contact pads includes a contact area in a first plane and an outermost area in a second plane different from the first plane.

DETAILED DESCRIPTION OF THE INVENTION

Figure 1:
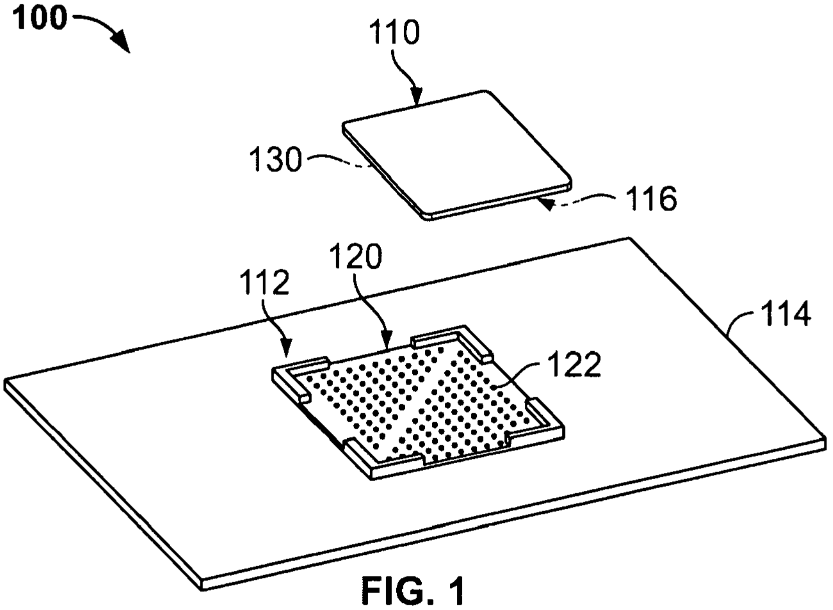
FIG. 1 is an exploded view of an electronic assembly including a land grid array (LGA) package formed in accordance with an exemplary embodiment of the present invention.

FIG. 1 illustrates an electronic assembly 100 including an electronic package 110 formed in accordance with an exemplary embodiment of the present invention. A socket connector 112 is mounted on a circuit board 114. When loaded into the socket connector 112, the electronic package 110 is electrically connected to the circuit board 114 through an interface 116 on the electronic package 110. By way of example, the electronic package is a land grid array module and may include a chip or module such as, but not limited to, a central processing unit (CPU), microprocessor, or an application specific integrated circuit (ASIC), or the like, and the interface 116 is a land grid array interface.

A socket contact field 120 is held within the socket connector 112. The contact field 120 includes a plurality of electrical contacts 122. In one embodiment, the socket contacts 122 may be stamped and formed metal spring contacts 122. The interface 116 on the electronic package 110 includes a mating face 130 that engages the contact field 120. The mating face 130 includes a plurality of contact pads (not shown in FIG. 1) that engage the contacts 122 to electrically connect the electronic package 110 to the circuit board 114 as will be described.

Figure 2:
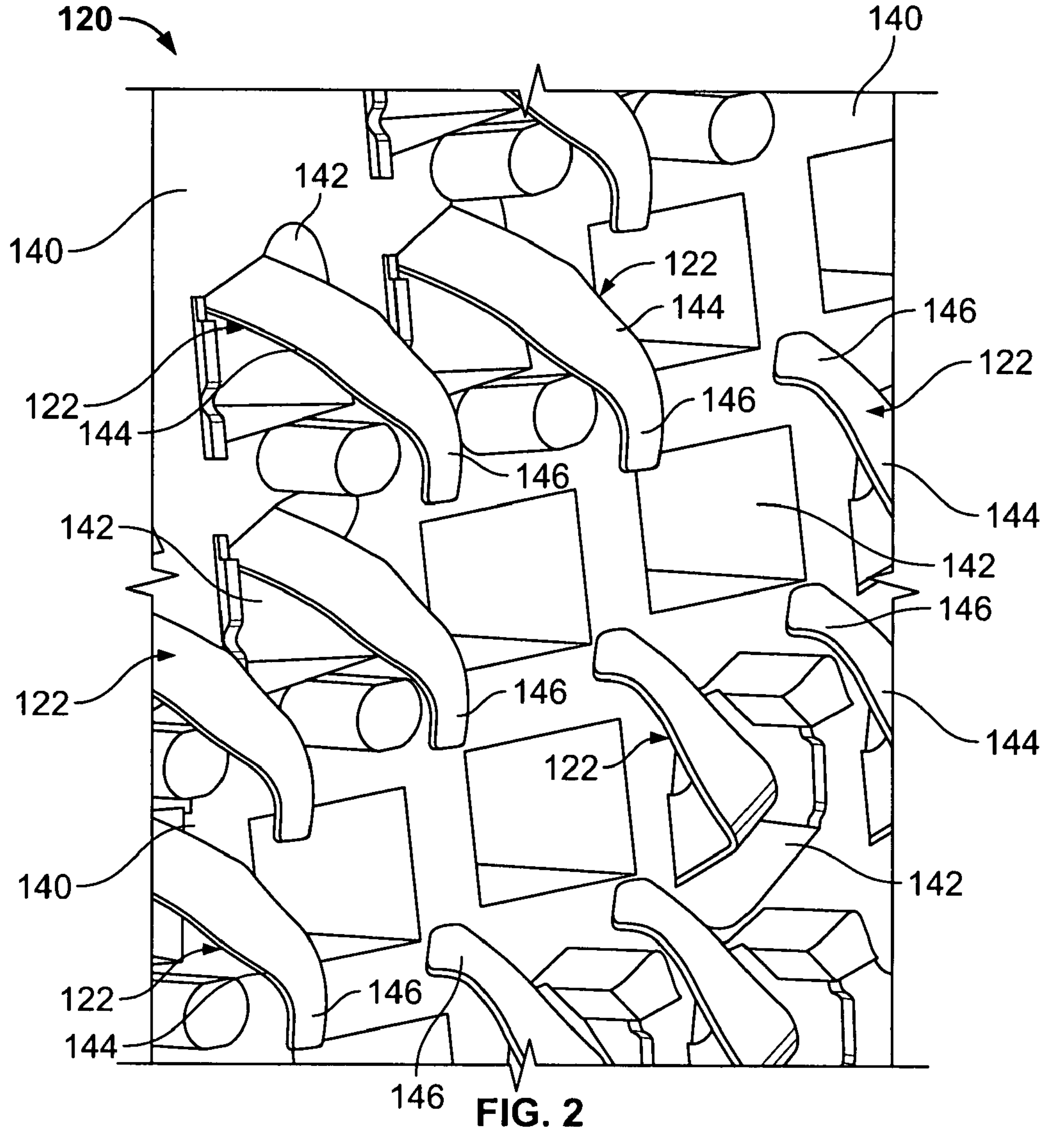
FIG. 2 is an enlarged fragmentary view of a portion of the socket contact field shown in FIG. 1.

FIG. 2 illustrates an enlarged fragmentary view of a portion of the contact field 120. The socket connector 112 (FIG. 1) includes a socket base 140 that defines the contact field 120. The socket base 140 includes a plurality of contact cavities 142. Deflectable contact arms 144 of the socket contacts 122 extend through the contact cavities 142. Each contact arm 144 includes a contact tip 146. The contacts 122 in an LGA socket connector, such as the socket connector 112, are subjected to a mating load when the electronic package 110 (FIG. 1) is loaded into the socket connector 112. The mating load deflects the contact arms 144 to assure that electrical connectivity is established between each of the contacts 122 and the electronic package 110. As the contact arms 144 deflect, the contact tips 146 wipe or slide along the surface of a mating contact pad 152 (FIG. 3) on the mating face 130 of the electronic package 110. As the density of the socket contacts 122 in the socket connector 112 and the density of the contact pads 152 on the electronic package 110 increase, the size of the socket contacts 122 and the contact pads 152 both tend to become smaller. The decreasing size of the contacts 122 and the contact pads 152, combined with the translation of the contact tips 146 across the contact pads 152, along with manufacturing tolerances, make proper registration of the contact tips 146 with the contact pads 152 more difficult. To address this situation, the contact pads 152 are provided with features to locate the contact tips 146 on the contact pads 152 as described below.

Figure 3:
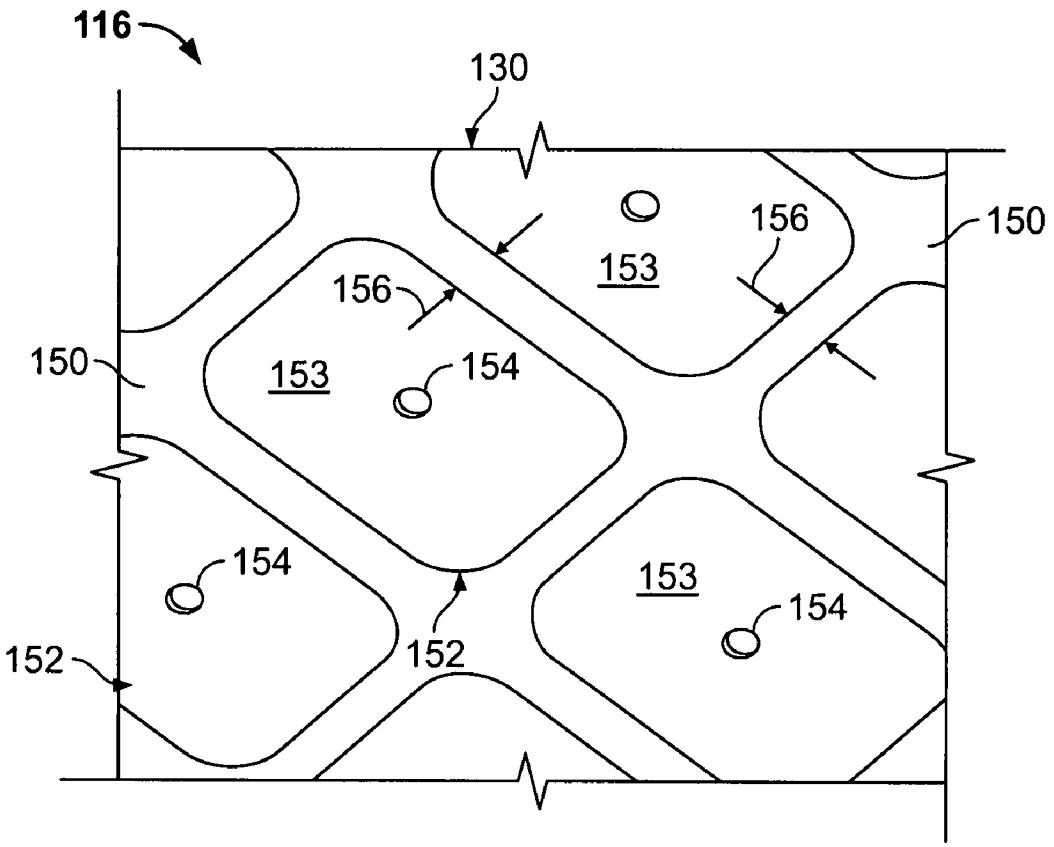
FIG. 3 is an enlarged fragmentary view of the mating face of an LGA package.

FIG. 3 illustrates an enlarged fragmentary view of the mating face 130 of the interface 116 on the electronic package 110. The mating face 130 includes a substrate surface 150 upon which an array of contact pads 152 are applied. The contact pads 152 have an exposed surface 153. In an exemplary embodiment, the contact pads 152 may be electroplated onto the substrate surface 150 according to known methods. In some embodiments, the contact pads 152 include a copper layer that is plated on the exposed surface 153 with a precious metal such as gold for improved electrical conductivity. In order to facilitate accurate registration of the mating contact tips 146 to the contact pads 152, the contact pads 152 are formed with a depression 154 in the exposed surface 153 that is sized and configured to capture and retain the contact tips 146 of the socket contacts 122 in registration with the contact pads 152 as the contact tips 146 wipe across the contact pads 152 when the electronic package 110 is loaded into the socket connector 112.

The contact pads 152 are placed on the substrate surface 150 with a spacing or pitch 156 between adjacent contact pads 152. The provision of the depression 154 on the contact pads 152 enables a contact pad pitch 156 that is substantially equal to the combined manufacturing tolerances of the electronic package 110 and the socket connector 112.

Figure 4:
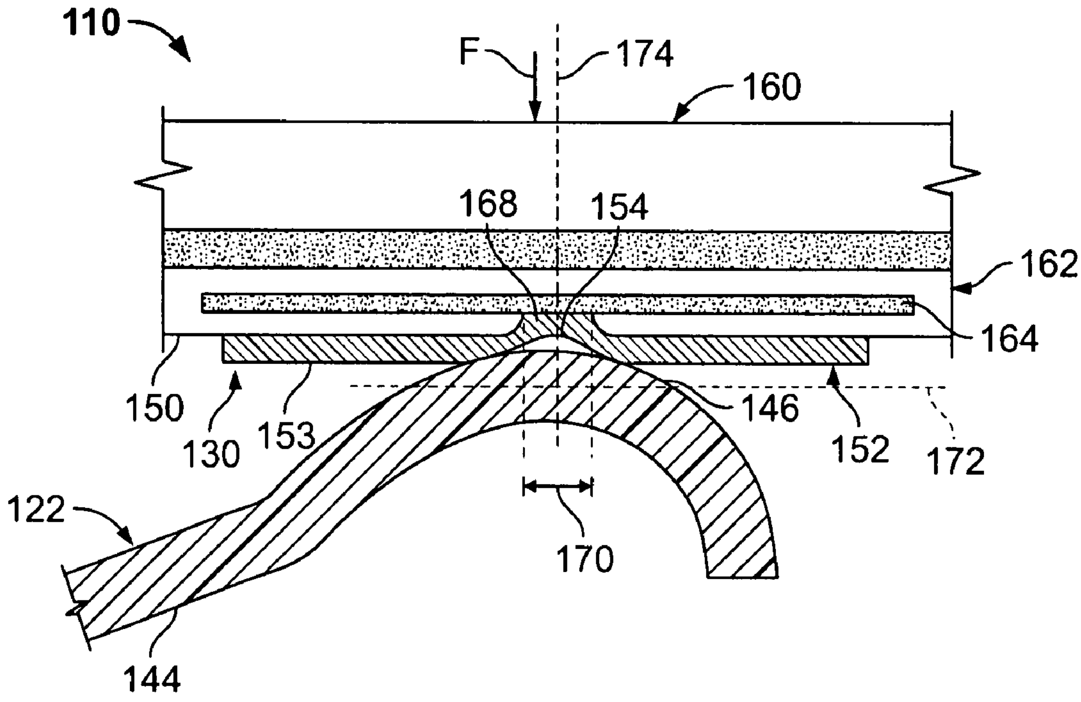
FIG. 4 is an enlarged cross-sectional view of a socket contact engaged with a contact pad on an LGA package.

FIG. 4 illustrates an enlarged cross-sectional view of a socket contact 122 engaged with a contact pad 152 on the electronic package 110. The electronic package 110 includes a silicon layer 160 that is joined to a substrate layer 162. In an exemplary embodiment, the silicon layer 160 is soldered to the substrate layer 162 at selected solder points. The substrate layer 162 includes the substrate surface 150 at the mating face 130 of the electronic package 110. The silicon layer 160 includes circuitry which may be, for example, an integrated circuit or processor. The integrated circuit includes electrical connections that terminate either directly to contact pads 152 on the substrate surface 150 or to traces 164 within the substrate layer 162 or on the substrate surface 150.

As illustrated in FIG. 4, the contact pad 152 may be positioned over a blind via 168 in the substrate layer 162 that extends to the internal trace 164 in the substrate layer. The via 168 is formed with a diameter 170 sized such that when the contact pad 152 is plated on the substrate surface 150, the depression 154 is formed at the via 168. Further, the diameter 170 of the via 168 is such that the depression 154 is sufficiently large to capture and retain the contact tip 146 as the contact tip 146 deflects in response to the mating load F and wipes across the contact pad 152. More specifically, the depression 154 is configured to restrain the movement of the mating contact tip 146 along a transverse axis 172. The mating load F is applied parallel to a load axis 174 that is substantially perpendicular to the transverse axis 172. It is to be understood that, the mating load F, although shown as a localized force F, is distributed over the silicon layer 160. The depression 154 has a concave contour that captures a convex portion of the socket contact tip 146. In this manner, the contact pad 152 limits the translation of the socket contact tip 146 across the contact pad 152 when the electronic package 110 is loaded into the socket connector 112. The substrate layer 162 may also include through vias that are provided to directly connect some contact pads directly to the circuits in the silicon layer. Others of the contact pads 152 may be positioned over traces 164 on the substrate surface 150. In such contact pads 152, depressions 154 may be stamped in the exposed surfaces 153 of the contact pads 152 and sized to capture and retain the socket contact tips 146.

Figure 5:
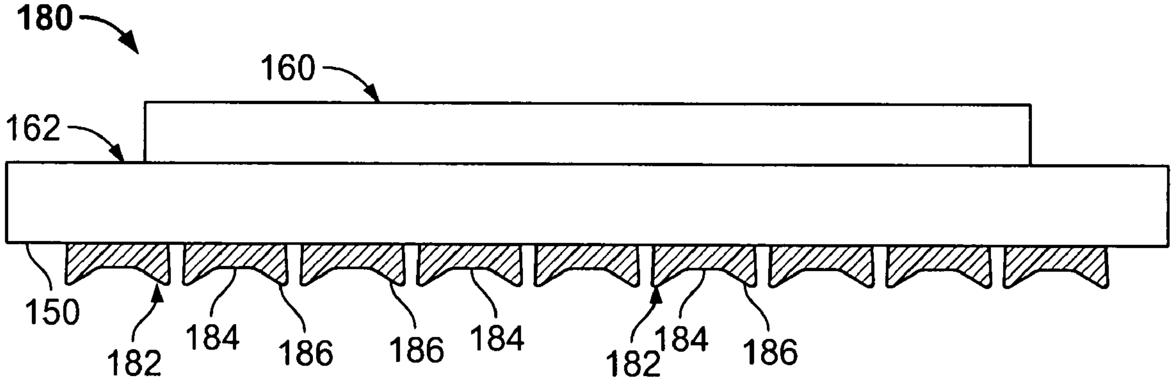
FIG. 5 is an enlarged partial cross sectional view of an LGA electronic package formed in accordance with an alternative embodiment of the present invention.

FIG. 5 illustrates an enlarged partial cross sectional view of an LGA electronic package 180 formed in accordance with an alternative embodiment of the present invention. The electronic package 180 includes the silicon layer 160 and the substrate layer 162 that is joined to the silicon layer 160 as previously described. An array of contact pads 182 are disposed on the substrate surface 150. The contact pads 182 may be located over vias in the substrate layer 162 or at traces on the surface 150 of the substrate layer 162. Each of the contact pads 182 includes a target contact area 184 that is surrounded by a raised conductive perimeter 186. More specifically, the raised conductive perimeter 186 defines a depression that includes the contact area 184.

Figure 6:
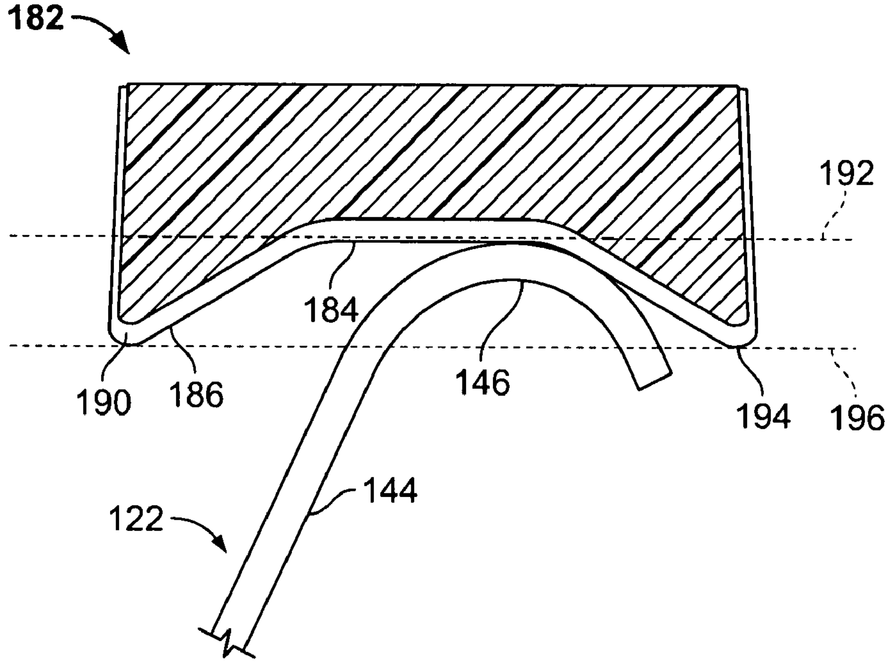
FIG. 6 is an enlarged view of a socket contact engaged with a contact pad shown in FIG. 5.

FIG. 6 is an enlarged view of a contact pad 182 with a socket contact 122 engaged therewith. The socket contact tip 146 of the socket contact 122 engages the contact area 184 and the raised conductive perimeter 186. The raised conductive perimeter 186 is configured to limit translation of the contact tip 146 across the contact pad 182. More specifically, the raised conductive perimeter 186 retains the contact tip 146 to insure that the contact tip 146 remains mated to its respective contact pad 182 under all tolerance conditions when the electronic package 180 (FIG. 5) is loaded into the socket connector 112 (FIG. 1). In an exemplary embodiment, the contact pad 182 is plated onto the substrate 150. The contact area 184 and the raised conductive perimeter 186 include a coating 190 of a precious metal such as gold. The contact area 184 lies in a first plane 192 while the outermost area 194 of the raised conductive perimeter 186 lies in a second plane 196 that is different from the first plane 192.

Figure 7:
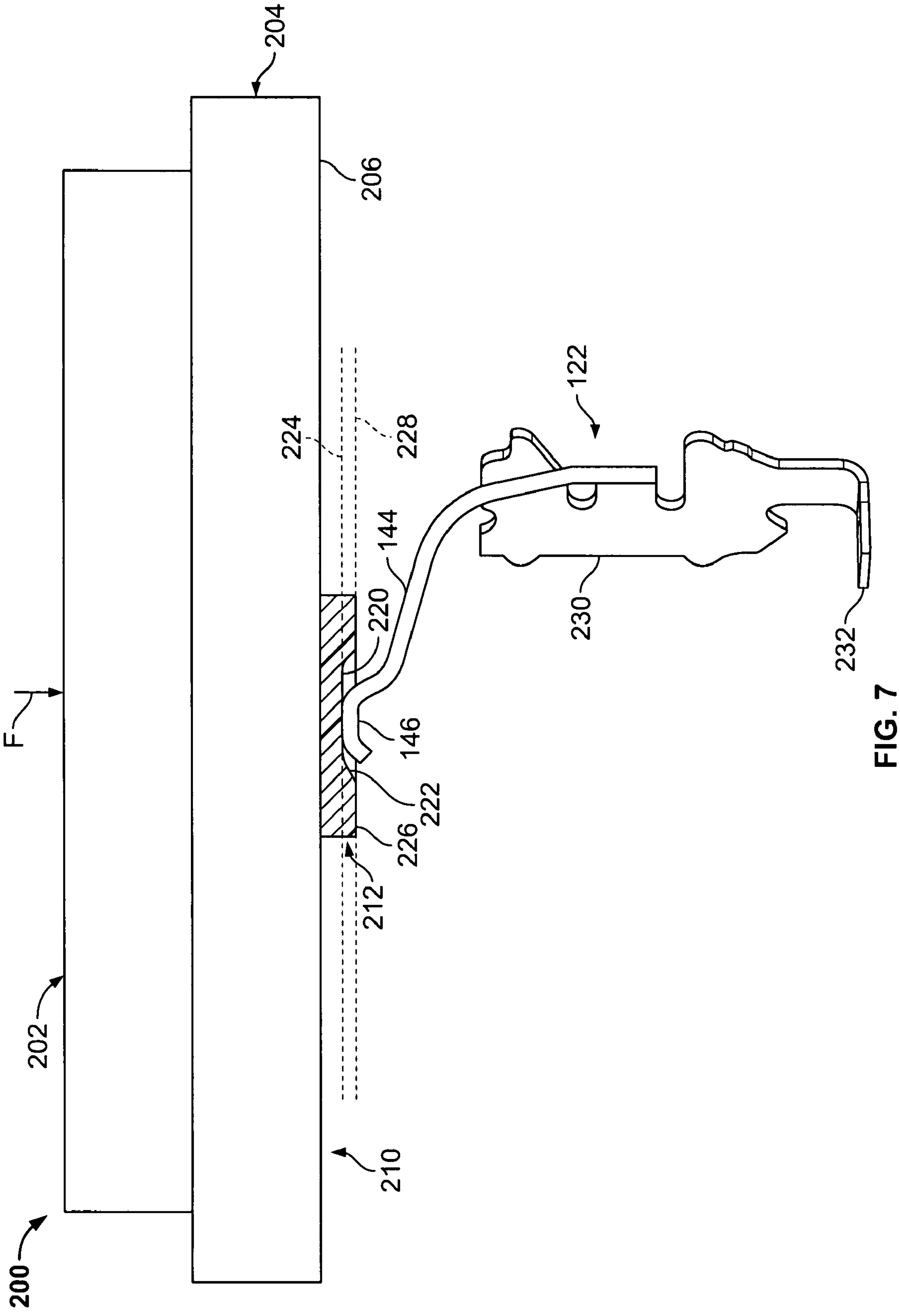
FIG. 7 is an enlarged partial cross sectional view of an LGA package formed in accordance with another alternative embodiment of the present invention.

FIG. 7 illustrates an enlarged partial cross sectional view of an LGA electronic package 200 formed in accordance with another alternative embodiment of the present invention. The electronic package 200 is shown in mating engagement with a socket contact 122. The electronic package 200 includes a silicon layer 202 and a substrate layer 204 that is joined to the silicon layer 202. As with the electronic package 110 previously described, the silicon layer 202 is soldered to the substrate layer 204 at selected solder points and includes electronic circuitry. The substrate layer 204 includes the substrate surface 206 at a mating face 210 of the electronic package 200. A plurality of contact pads 212 are disposed on the substrate surface 206. The contact pads 212 may be located over vias in the substrate layer 204 or at traces on the surface 206 of the substrate layer 204. The circuitry in the silicon layer includes electrical connections that terminate either directly to the contact pads 212 on the substrate surface 206 or to traces (not shown) within the substrate layer 204 or on the substrate surface 206.

The contact pad 212 is formed with a target contact area 220 that is surrounded by a raised conductive perimeter 222 such that a depression is formed that includes the contact area 220. The raised conductive perimeter 222 is configured to limit translation of the contact tip 146 across the contact pad 212. The provision of raised conductive perimeter 222 on the contact pads 212 enables a contact pad pitch or spacing between adjacent contact pads (see FIG. 3) that is substantially equal to the combined manufacturing tolerances of the electronic package 200 and the socket connector 112 (FIG. 1). More specifically, the raised conductive perimeter 222 retains the contact tip 146 to insure that the contact tip 146 remains mated to its respective contact pad 212 under all tolerance conditions when the electronic package 200 is loaded into the socket connector 112. In an exemplary embodiment, the contact pad 212 is plated onto the substrate 204. The contact area 220 and the raised perimeter 222 are further plated with a precious metal such as gold. The contact area 220 lies in a first plane 224 while an outermost area 226 of the raised conductive perimeter 222 lies in a second plane 228 that is different from the first plane 224.

As previously described, the contact tip 146 is formed on the end of the flexible contact arm 144. The contact arm 144 extends from a contact body 230 that is configured to retain the contact 122 in the contact cavity 142 in the socket base 140 (FIG. 2). The contact 122 includes a mounting end 232 that is soldered to the circuit board 114 (FIG. 1). When loaded into the socket connector 112 (FIG. 1), the contact arm 144 is deflected in response to the mating load F. Reaction to the mating load F assists in retaining the contact tip 146 in the contact area 220 of the contact pad 212.

The embodiments thus described provide an LGA electronic package that facilitates reliable registration of contact pads on the electronic module to the contacts in an LGA socket. Proper registration of the socket contacts to the contact pads is achieved even as socket contact pitch and contact pad pitch approach the combined manufacturing tolerances of the electronic package and the socket. The electronic package includes contact pads configured to capture and retain socket contacts when the electronic package is loaded into a socket connector under all tolerance conditions.

While the invention has been described in terms of various specific embodiments, those skilled in the art will recognize that the invention can be practiced with modification within the spirit and scope of the claims.

What is claimed is:

1. A land grid array interface comprising:

a substrate having a mating face, an internal trace disposed within said substrate, and a via extending from said mating face to said internal trace; and a contact pad provided on said mating face and extending from said mating face to said internal trace of said substrate through said via to electrically couple with said internal trace, said contact pad having an exposed surface with a depression that is configured to restrain transverse movement of a mating contact tip when said mating contact tip is loaded against said contact pad, said contact pad electrically coupling said mating contact tip with said internal trace when said mating contact tip is loaded against said contact pad.

2. The land grid array interface of claim 1, wherein said via has a diameter such that said depression is formed in said contact pad when said contact pad is plated over said via.

3. The land grid array interface of claim 1, wherein said depression is stamped in said exposed surface of said contact pad.

4. The land grid array interface of claim 1, wherein said contact pad includes a raised conductive perimeter surrounding said depression.

5. The land grid array interface of claim 1, wherein said contact pad is electroplated onto said substrate.

6. The land grid array interface of claim 1, wherein said depression is concave and the mating contact tip is convex.

7. The land grid array interface of claim 1, wherein said substrate is joined to a silicon layer.

8. A land grid array interface comprising:

a substrate having a mating face, a conductive trace and a via extending into said substrate to said conductive trace; and a contact pad provided on said mating face of said substrate and extending into said via of said substrate to the conductive trace, said contact pad being configured to capture and retain a mating contact tip in registration with said contact pad when said mating contact tip is deflected during loading of said mating contact tip against said contact pad to maintain an electric coupling between said conductive trace and said mating contact tip during deflection of said mating contact tip.

9. The land grid array interface of claim 8, wherein said contact pad includes an exposed surface with a depression that is configured to capture and retain the mating contact tip.

10. The land grid array interface of claim 8, wherein said via has a diameter such that a depression is formed in said contact pad when said contact pad is plated over said via, and wherein said depression is configured to capture and retain said mating contact tip.

11. The land grid array interface of claim 8, wherein said contact pad includes an exposed surface with a depression stamped therein.

12. The land grid array interface of claim 8, wherein said contact pad includes a depression surrounded by a raised conductive perimeter.

13. The land grid array interface of claim 8, wherein said contact pad is electroplated onto said substrate.

14. The land grid array interface of claim 8, wherein said substrate is joined to a silicon layer.

15. The land grid array interface of claim 1, wherein the depression extends into the contact pad from the exposed surface toward the substrate.

16. The land grid array interface of claim 9, wherein the depression extends into the contact pad from the exposed surface toward the substrate.

* * * * *